(12) United States Patent
Wang et al.

(10) Patent No.: US 8,987,605 B2
(45) Date of Patent: Mar. 24, 2015

(54) FORMATION OF CONNECTORS WITHOUT UBM

(75) Inventors: Tsung-Ding Wang, Tainan (TW);
Hung-Jen Lin, Tainan (TW);
Chien-Hsiun Lee, Chu-Tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 460 days.

(21) Appl. No.: 13/247,529

(22) Filed: Sep. 28, 2011

(65) Prior Publication Data

US 2013/0075139 A1 Mar. 28, 2013

(51) Int. Cl.
| | |
|---|---|
| H05K 1/09 | (2006.01) |
| B23K 31/02 | (2006.01) |
| B23K 1/20 | (2006.01) |
| H01L 23/31 | (2006.01) |
| H01L 21/56 | (2006.01) |
| H01L 23/00 | (2006.01) |
| H01L 23/29 | (2006.01) |

(52) U.S. Cl.
CPC .......... *H01L 23/3192* (2013.01); *H01L 21/561* (2013.01); *H01L 24/11* (2013.01); *H01L 24/13* (2013.01); *H01L 2224/02379* (2013.01); *H01L 23/293* (2013.01); *H01L 24/16* (2013.01); *H01L 2224/0391* (2013.01); *H01L 2224/0401* (2013.01); *H01L 2224/05548* (2013.01); *H01L 2224/05567* (2013.01); *H01L 2224/05647* (2013.01); *H01L 2224/10126* (2013.01); *H01L 2224/1131* (2013.01); *H01L 2224/11334* (2013.01); *H01L 2224/11849* (2013.01); *H01L 2224/13022* (2013.01); *H01L 2224/73204* (2013.01); *H01L 2224/81024* (2013.01); *H01L 2224/94* (2013.01); *H01L 2224/11515* (2013.01)
USPC ............................ 174/257; 228/203; 228/165

(58) Field of Classification Search
USPC ........................................................ 174/257
See application file for complete search history.

(56) References Cited

U.S. PATENT DOCUMENTS

| | | | | |
|---|---|---|---|---|
| 6,400,021 | B1 * | 6/2002 | Cho ............................... | 257/738 |
| 6,441,487 | B2 * | 8/2002 | Elenius et al. ................ | 257/738 |
| 8,446,019 | B2 * | 5/2013 | Alvarado et al. ............. | 257/780 |
| 8,513,818 | B2 * | 8/2013 | Hagihara ...................... | 257/781 |
| 2011/0157853 | A1 * | 6/2011 | Goh ............................... | 361/783 |

OTHER PUBLICATIONS

Serene Lee Choon Mei; Carlo Marbella; Tan Ai Min, "No-clean polymer flux evaluations and its impact on BGA solder joint quality and board level reliability," Electronic Manufacturing Technology Symposium (IEMT), 2010 34th IEEE/CPMT International , vol., No., pp. 1,7, Nov. 30, 2010-Dec. 2, 2010.*

* cited by examiner

*Primary Examiner* — William H Mayo, III
*Assistant Examiner* — Hiram E Gonzalez
(74) *Attorney, Agent, or Firm* — Slater & Matsil, L.L.P.

(57) ABSTRACT

A device includes a substrate, a metal pad over the substrate, and a passivation layer having a portion over the metal pad. A post-passivation interconnect (PPI) is electrically coupled to the metal pad, wherein the PPI includes a portion over the metal pad and the passivation layer. A polymer layer is over the PPI. A solder ball is over the PPI. A compound includes a portion adjoining the solder ball and the polymer layer, wherein the compound includes flux and a polymer.

19 Claims, 10 Drawing Sheets

FORMATION OF CONNECTORS WITHOUT UBM

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance and the density of modern integrated circuits.

On top of the interconnect structures, bond pads or metal bumps are formed and exposed on the surface of the respective chip. Electrical connections are made through the bond pads/metal bumps to connect the chip to a package substrate or another die. The electrical connections may be made through wire bonding or flip-chip bonding.

Wafer level chip scale packaging (WLCSP) is currently widely used for its low cost and relatively simple processes. In a typical WLCSP, interconnect structures are formed on metal layers, followed by the formation of under-bump metallurgy (UBM), and the placement and the reflow of solder balls.

The cost for forming the UBM is typically high. The formation of the UBM, however, could not be skipped since the removal of the UBM results in several problems, and the resulting package may fail in the reliability tests.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A post-passivation structure and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
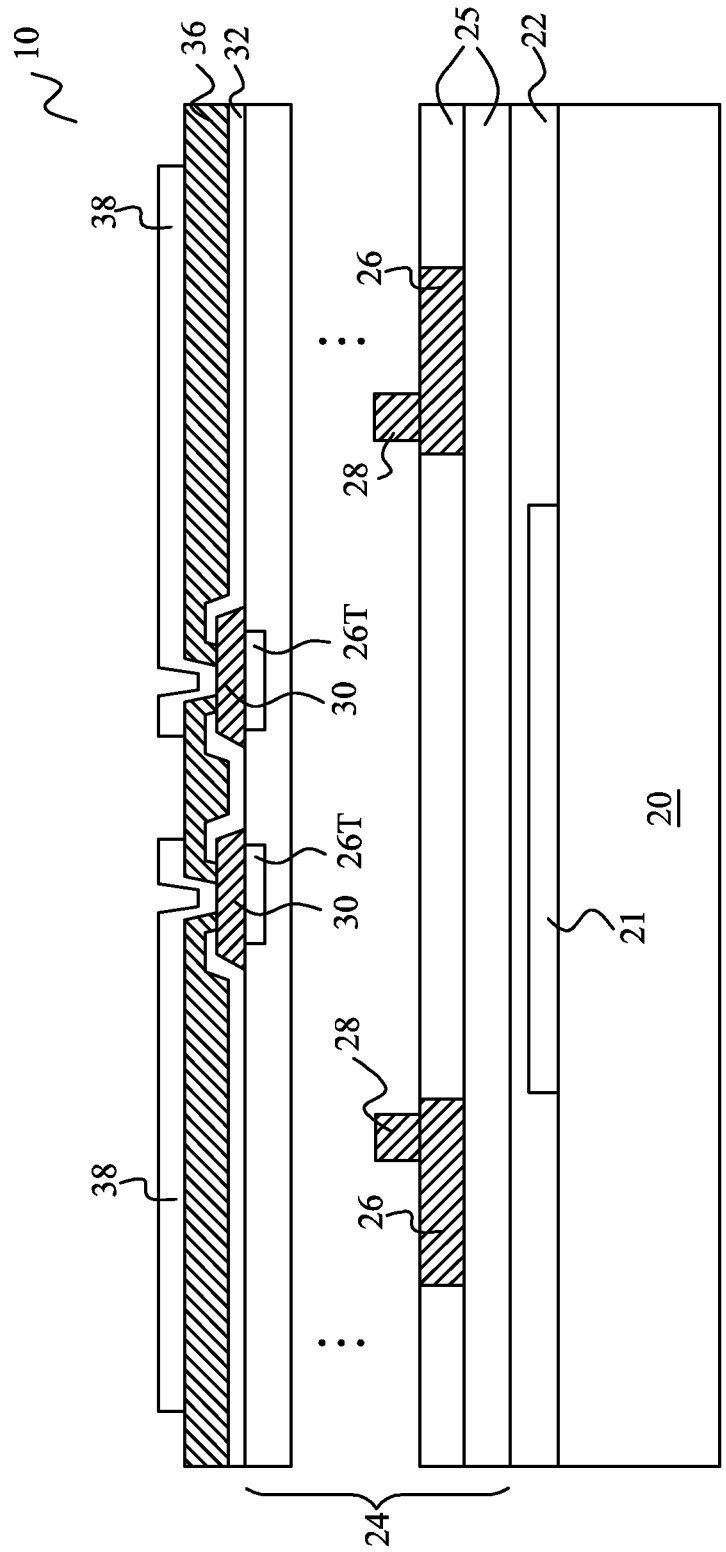
FIGS. 1 through 9 are cross-sectional views of intermediate stages in the manufacturing of packages in accordance with various embodiments.

Referring to FIG. 1, wafer 10, which includes semiconductor substrate 20, is provided. Semiconductor substrate 20 may be a bulk silicon substrate or a silicon-on-insulator substrate, while other semiconductor materials including group III, group IV, and group V elements may also be used. Integrated circuit devices such as transistors (schematically illustrated as 21) are formed at a surface of semiconductor substrate 20. Wafer 10 may further include inter-layer dielectric (ILD) 22 over semiconductor substrate 20, and metal layers 24 over ILD 22. Metal lines 26 and vias 28 are formed in dielectric layers 25. The combination of metal lines at a same level is referred to a metal layer hereinafter. Accordingly, a plurality of metal layers 24 are interconnected through vias 28. In an embodiment, dielectric layers 25 are formed of low-k dielectric materials. The dielectric constants (k values) of the low-k dielectric materials may be less than about 3.0, or less than about 2.5, for example. Metal lines 26 and vias 28 may be formed of copper or copper alloys, although they can also be formed of other metals. One skilled in the art will realize the formation details of the metal layers. Top metal pads 26T are formed as a part of the top metal layer in metal layers 24.

Metal pads 30 are formed over metal layers 24, and may by electrically coupled to metal lines 26 and vias 28. Metal pads 30 may be aluminum pads or aluminum-copper pads, and hence are alternatively referred to as aluminum pads 30 hereinafter, although other metallic materials may be used. Passivation layer 32 is formed over metal layers 24. Portions of passivation layer 32 may cover the edge portions of aluminum pads 30. Central portions of aluminum pads 30 are exposed through the openings in passivation layer 32. Passivation layer 32 may be a single layer or a composite layer, and may be formed of a non-porous material. In an embodiment, passivation layer 32 is a composite layer comprising a silicon oxide layer (not shown), and a silicon nitride layer (not shown) over the silicon oxide layer. Passivation layer 32 may also be formed of un-doped silicate glass (USG), silicon oxynitride, and/or the like.

Polymer layer 36 is formed over passivation layer 32. Polymer layer 36 may be formed of a polymer such as an epoxy, polyimide, benzocyclobutene (BCB), polybenzoxazole (PBO), and the like. The formation methods may include spin coating, for example. Polymer layer 36 is patterned to form openings, through which aluminum pads 30 are exposed. The patterning of polymer layer 36 may include photo lithography techniques. A curing step may then be performed to cure polymer layer 36.

Post-passivation interconnects (PPI) 38 are formed to electrically connect to aluminum pad 30 through the openings in polymer layer 36. PPIs 38 are such named since the formation of PPIs 38 is after the formation of passivation layer 32. PPI 38 may be formed of pure copper, substantially pure copper, or a copper alloy. PPIs 38 may further include a nickel-containing layer. The formation methods include electro plating, electroless plating, sputtering, chemical vapor deposition methods, and the like.

Figure 2:
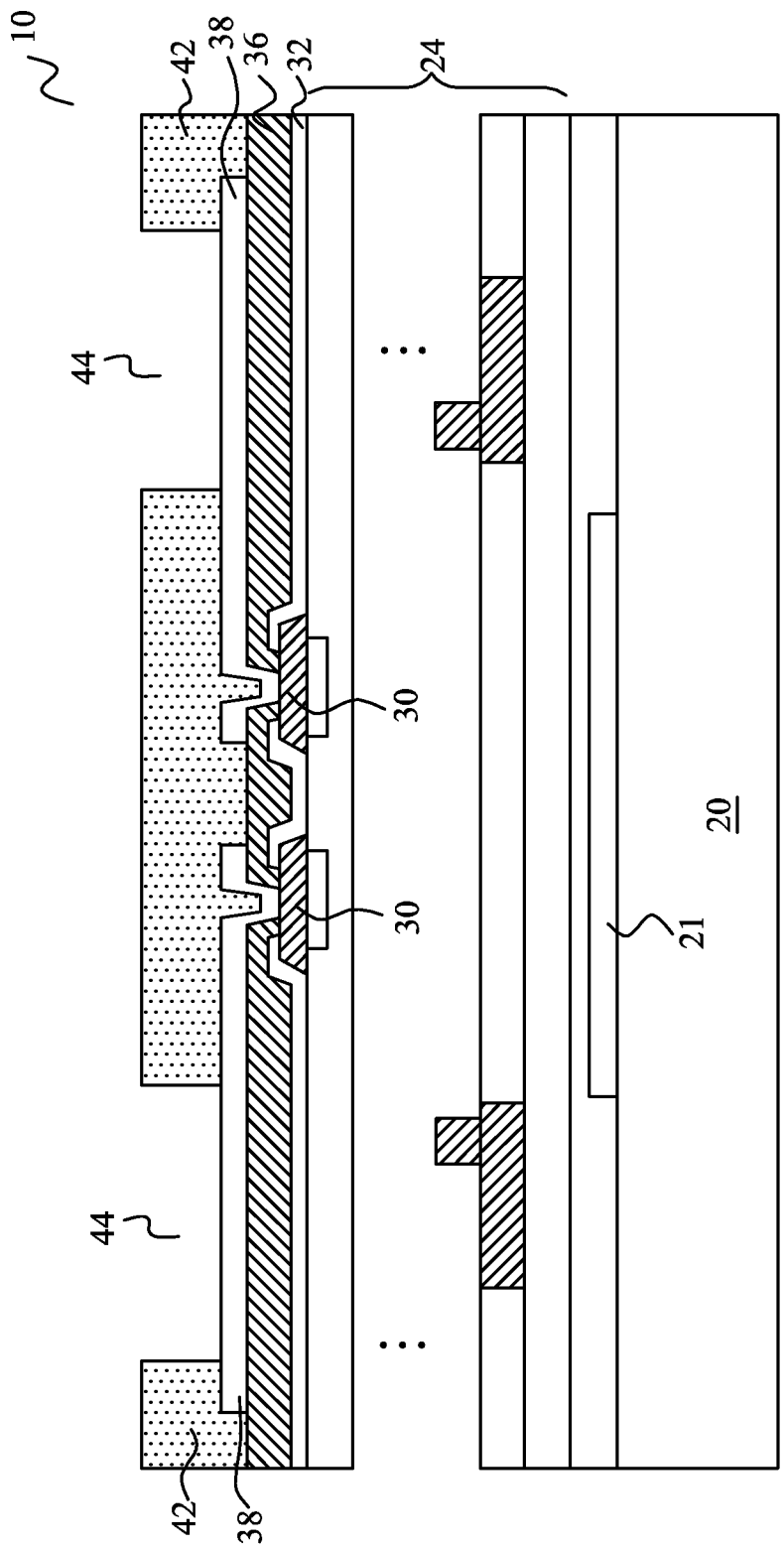

FIG. 2 illustrates the formation and patterning of polymer layer 42. Polymer layer 42 may comprise polyimide or other polymer based materials such as epoxy, BCB, PBO, and the like. In an embodiment, polymer layer 42 is formed of spin coating, or formed of a laminate film, which is laminated on PPI lines 38 and polymer layer 36. After the patterning of polymer layer 42, portions of PPIs 38 are exposed through openings 44. In an embodiment wherein PPIs 38 are formed of a copper-containing material, the copper-containing material may be exposed through openings 44 in polymer layer 42.

Figure 3:
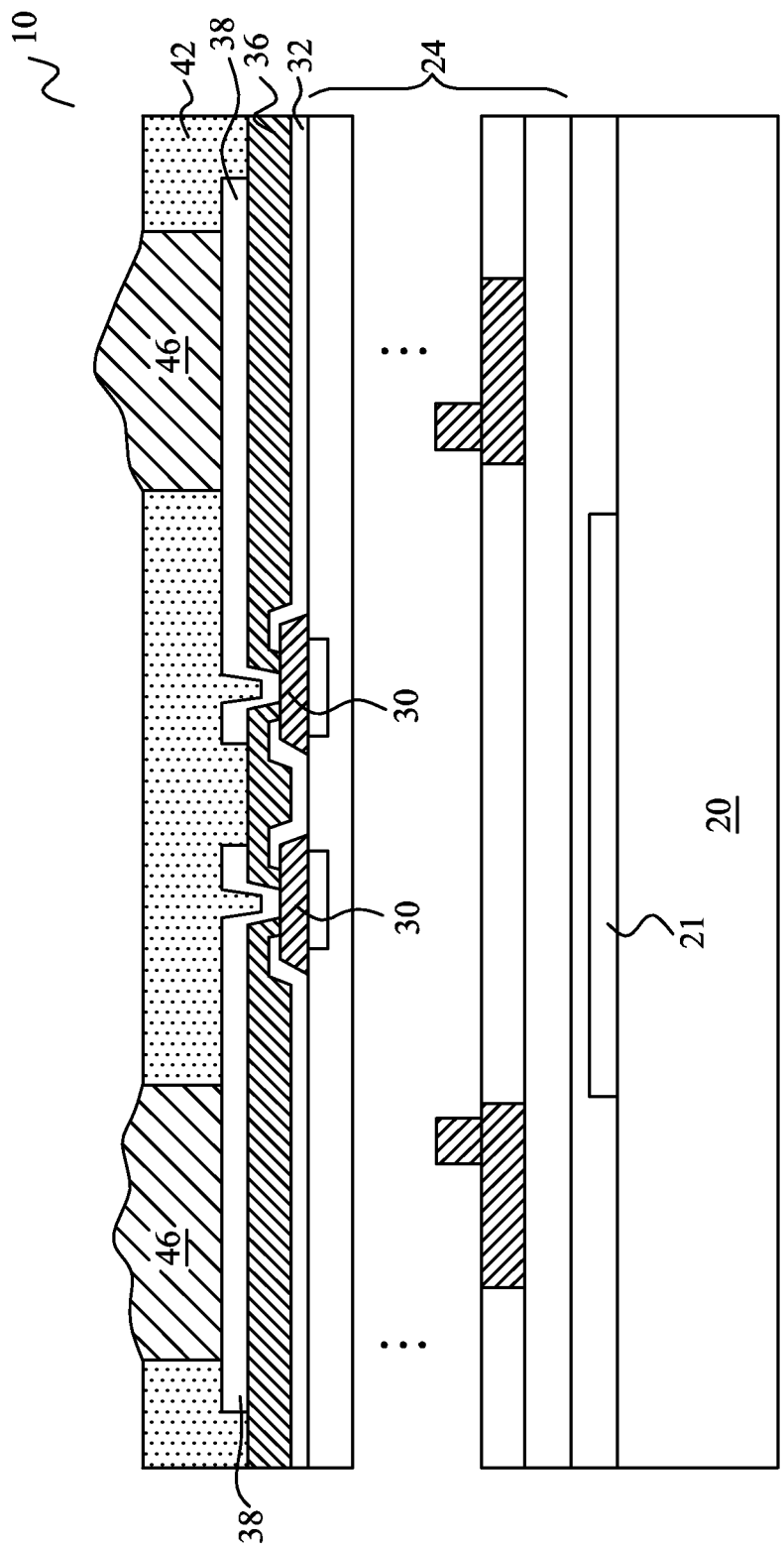

Referring to FIG. 3, compound 46 is dispensed into openings 44. The method for dispensing compound 46 may include dipping, jetting, coating, printing, or the like. Compound 46 comprises flux (for soldering) and a polymer material. In an embodiment, the polymer material comprises an epoxy, which may be a gel, an adhesive, or the like. The polymer material may also be an underfill. In an embodiment, compound 46 may cover openings 44 fully, so that no PPIs 38 are exposed after the dispensing of compound 46. Compound 46 may be slightly flowable, although it may have a high viscosity.

Figure 4:
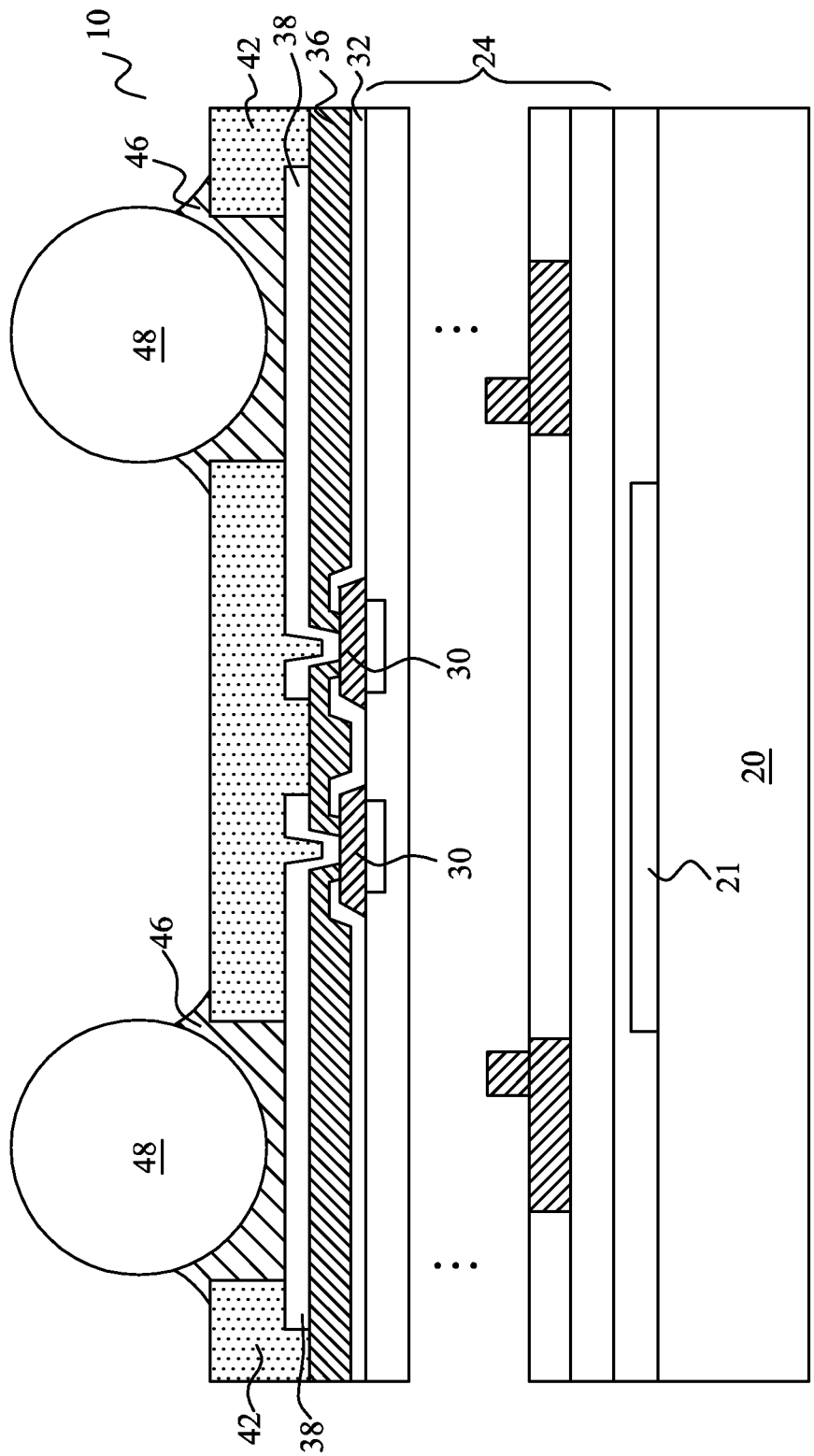
Figure 5A:
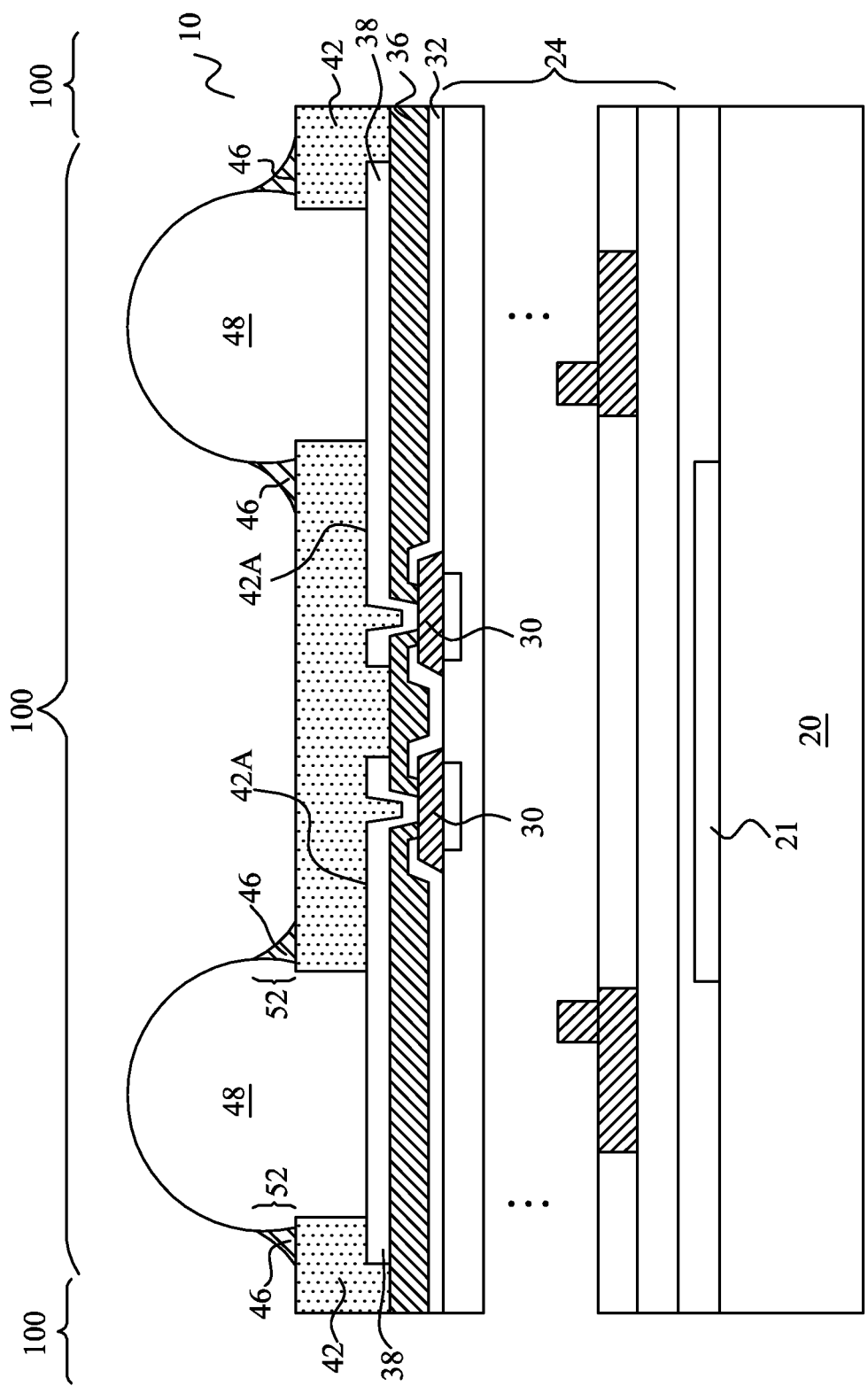
Figure 5B:
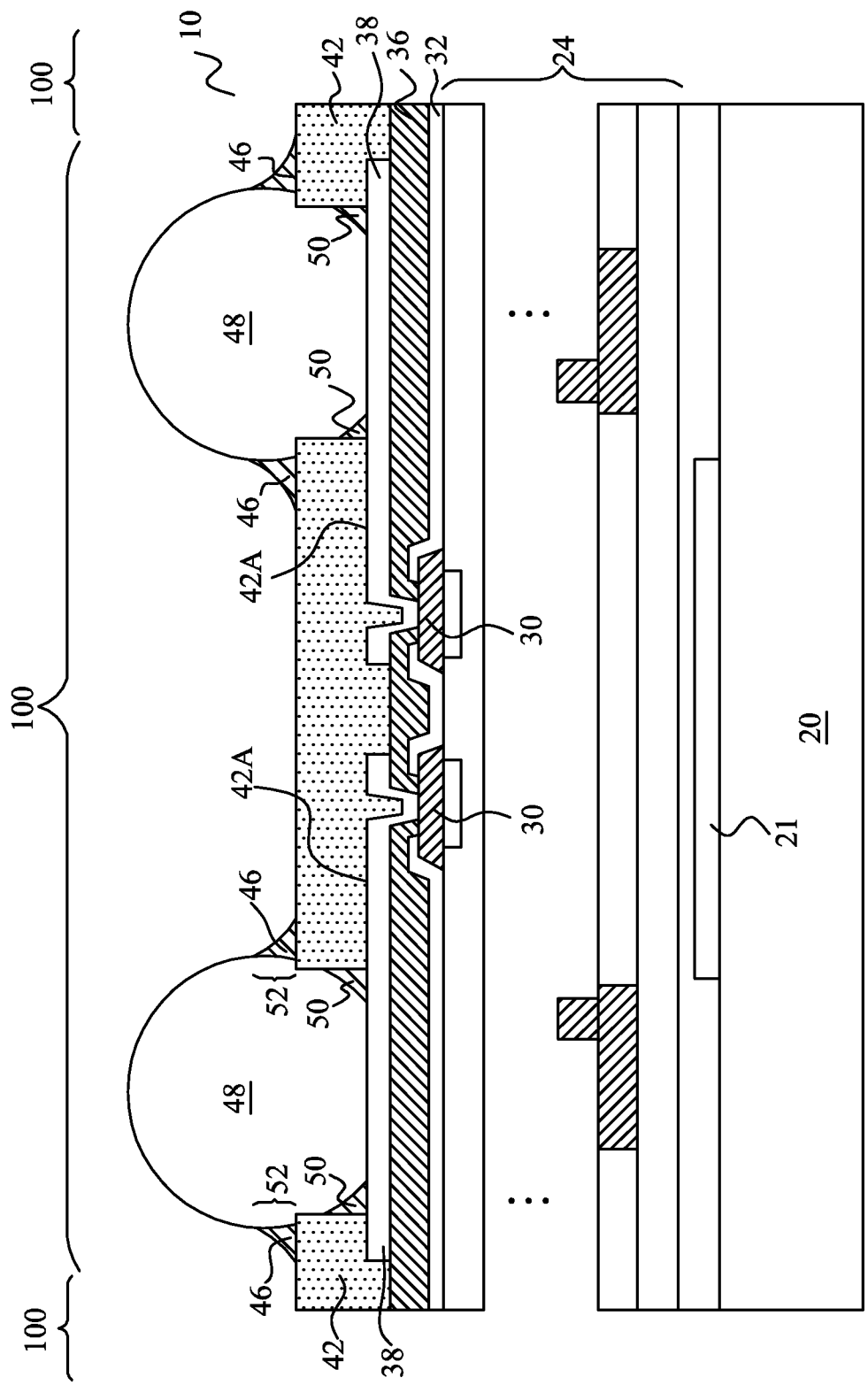

Referring to FIG. 4, connectors 48 are formed. In some embodiments, connectors 48 comprise solders, and are referred to as solder balls 48 hereinafter, although connectors 48 may be formed of other materials. Solder balls 48 are placed on compound 46. The structure shown in FIG. 4 may then go through a reflow process and optionally an additional post thermal cure process in addition to the reflow process, and solder balls 48 are reflowed. The resulting structure is shown in FIGS. 5A and 5B. After the reflow, solder ball 48 are joined to, and are in physical contact with, PPIs 38. The interfaces between solder balls 48 and the respective underlying PPIs 38 may be substantially level with the adjacent bottom surfaces 42A of polymer layer 42. The top ends of compound 46 are lower than the top ends of solder balls 48. The flux in compound 46 helps the adhesion of solder balls 48 to PPIs 38. In an embodiment as shown in FIG. 5A, after the reflow, compound 46 may be squeezed out of openings 44 (not shown in FIG. 5A, please refer to FIG. 3). In alternative embodiment, as shown in FIG. 5B, after the reflow process compound 46 comprises portions 50, which may be filled into the regions formed between PPIs 38, polymer layer 42, and solder balls 48. Compound 46 also comprises portions 52, which are directly over, and in physical contact with, polymer layer 42. Portions 52 of compound 46 are also in contact with solder balls 48. Portions 50 and 52 of compound 46 insulate PPIs 38 from external detrimental substances such as moisture, and also act as the adhesion between polymer layer 42 and solder balls 48. Accordingly, the reliability of the resulting package is improved. In an embodiment, in the reflow process, compound 46 is cured, and there is no additional curing process performed after the reflow process. In alternative embodiments, after the reflow process, an additional curing process is performed to further cure compound. After the reflow, a die saw step may be performed, and wafer 10 is sawed apart into dies. One of the resulting dies 100 is shown in FIG. 6.

Figure 6:
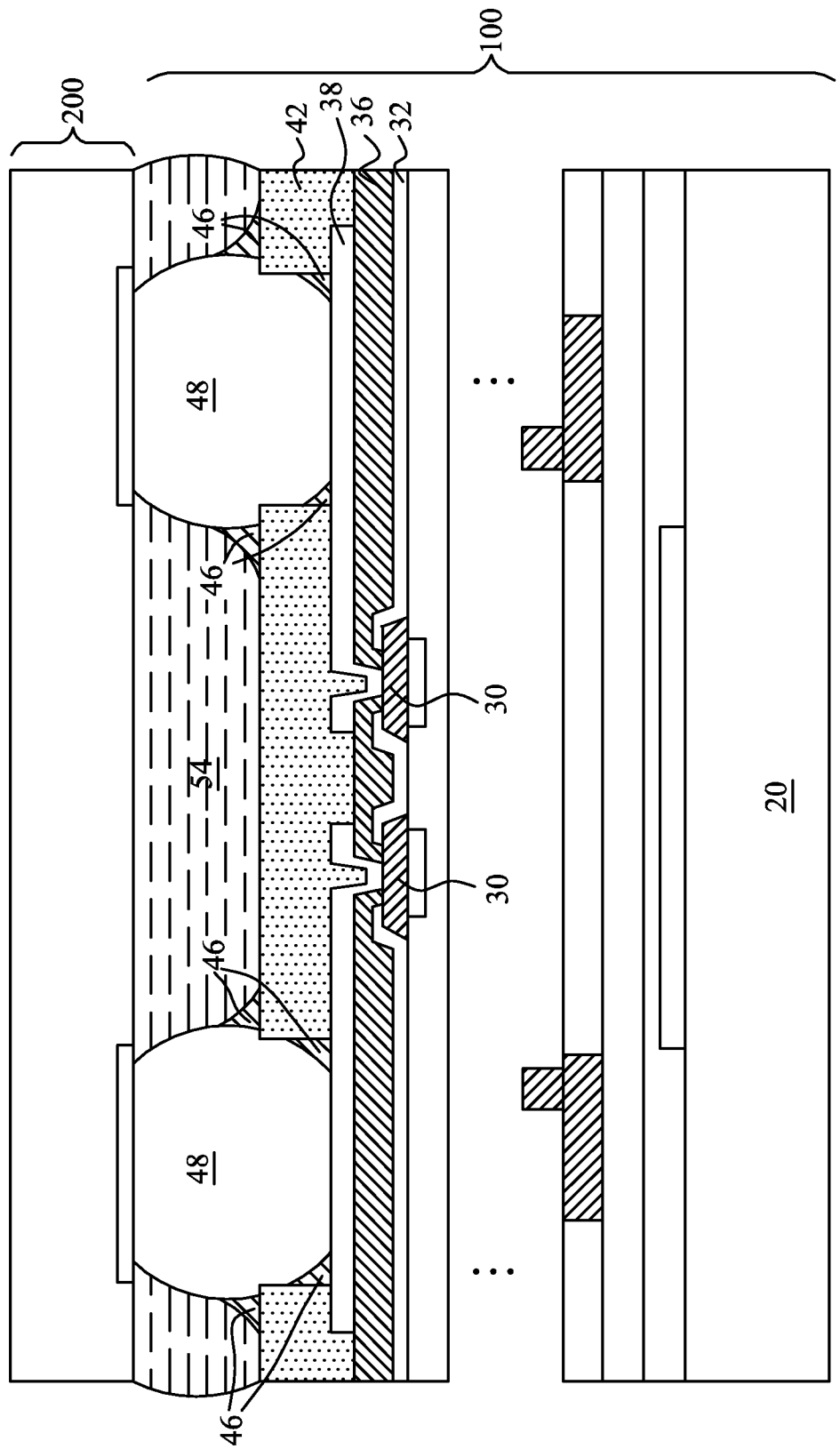

FIG. 6 also illustrates a package after die 100 is bonded to package component 200. Package component 200 may be a device die that comprises transistors, a package substrate, a printed circuit board (PCB), an interposer that does not include active devices (although passivation may be included), or the like. In some embodiments, after the bonding of die 100 to package component 200, underfill 54 may be dispensed between die 100 and package component 200. Underfill 54 may be in contact with compound 46 and solder balls 48.

Figure 7:
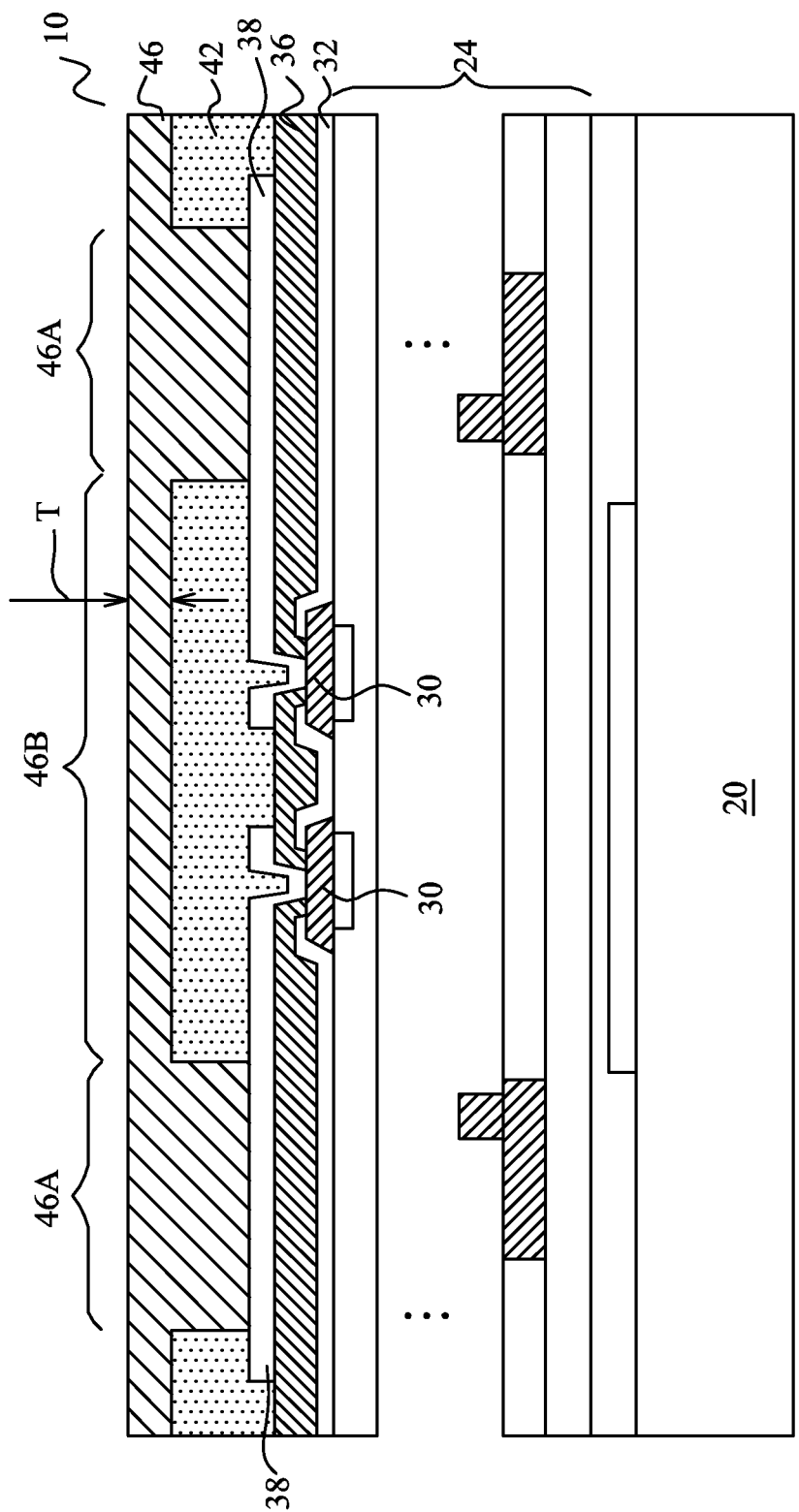
Figure 8:
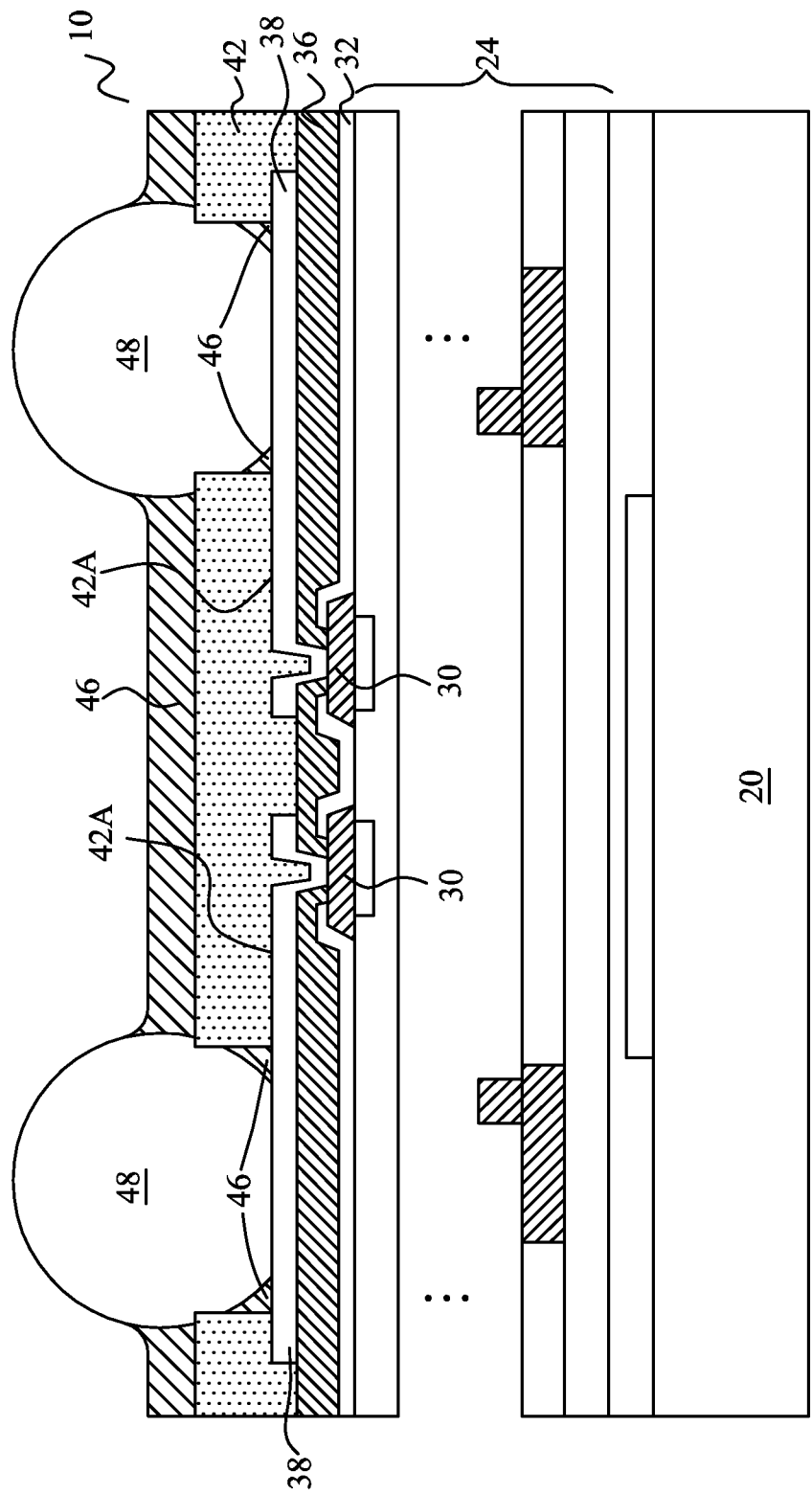
Figure 9:
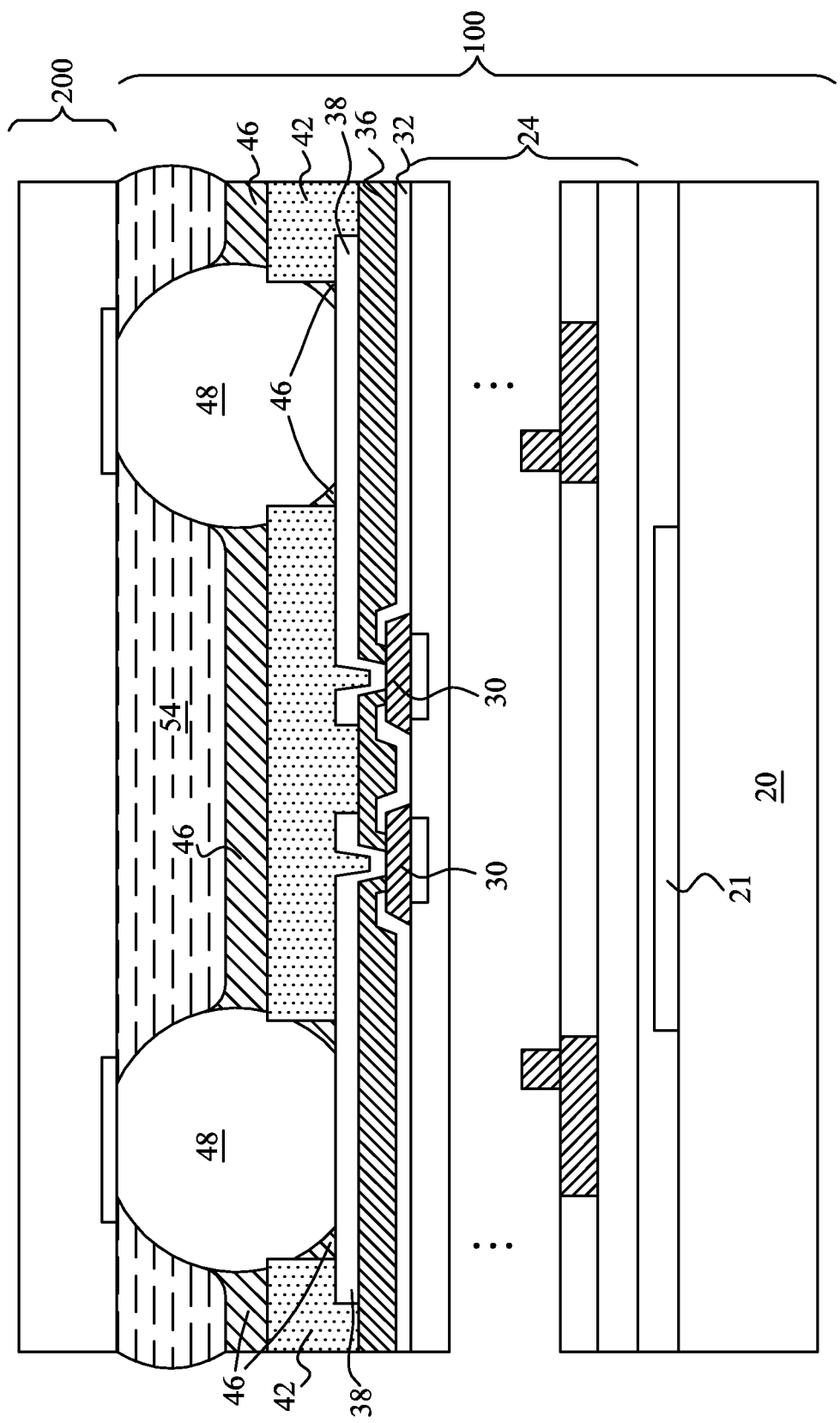

In FIGS. 5A and 5B and 6, portions of compound 46 adjoining neighboring solder balls 48 are discrete portions that are not connected to each other. FIG. 7 through 9 illustrates the cross-sectional views of intermediate stages in the formation of a package structure in accordance with alternative embodiments. Unless specified otherwise, the reference numerals in these embodiments represent like elements in the embodiments illustrated in FIGS. 1 through 6. The initial steps of this embodiment are essentially the same as shown in FIGS. 1 and 2. Next, referring to FIG. 7, compound 46 is applied as a blanket layer, which is filled in to openings 44, and is also formed over and vertically overlapping polymer layer 42. In some embodiments, compound 46 includes first portions 46A that are filled into (and directly over) neighboring openings 44, and second portion 46B interconnecting first portions 46A. Compound 46 may also be formed as a blanket layer that covers substantially an entirety of wafer 10. Thickness T of compound 46 may be greater than the thickness of passivation layer 32, for example.

FIG. 8 illustrates the respective wafer 10 after the placement and the curing of solder balls 48. In the resulting structure, compound 46 forms a layer that covers wafer 10, which layer may cover substantially an entirety of wafer 10, except solder balls 48 are exposed through compound 46. FIG. 9 illustrates a respective package formed from the structure shown in FIG. 8, wherein compound 46 is blanket applied, and extends from one of neighboring solder balls 48 to the other. Wafer 10 may be sawed into dies before or after being bonded to package component 10, wherein one of dies 100 is shown in FIG. 9.

In FIGS. 6 and 9, compound 46 remains in the final package, and includes the polymer. In an embodiment, after the reflow process, for example, between the reflow of solder balls 48 and the bonding of die 100 to package component 200, there is no flux clean step for removing the residue of the flux. The flux and the polymer thus remain in the final structure.

By using the embodiments, no UBM needs to be formed over PPIs and in the openings in polymer layer 42 (FIGS. 6 and 9). The manufacturing cost for forming the UBM is thus reduced. On the other hand, the addition of the polymer into compound 46 improves the reliability of the resulting packages, so that the reliability requirement of the respective WLCSP may still be satisfied.

In accordance with embodiments, a device includes a substrate, a metal pad over the substrate, and a passivation layer having a portion over the metal pad. A PPI is electrically coupled to the metal pad, wherein the PPI includes a portion over the metal pad and the passivation layer. A polymer layer is over the PPI. A solder ball is over the PPI. A compound includes a portion adjoining the solder ball and the polymer layer, wherein the compound includes flux and a polymer.

In accordance with other embodiments, a device includes a substrate, a metal pad over the substrate, and a passivation layer having a portion over the metal pad. A PPI is electrically coupled to the metal pad, wherein the PPI includes a portion over the metal pad and the passivation layer. A polyimide layer is over the PPI. A solder ball is over and in physical contact with the PPI. A compound includes a flux and a polymer, wherein the compound extends to over a top surface of the polyimide layer, and is in physical contact with the solder ball and the polyimide layer.

In accordance with yet other embodiments, a method includes forming a passivation layer having a portion over a metal pad, and forming a PPI electrically coupled to the metal pad, wherein the PPI line includes a portion over the metal pad and the passivation layer. A polymer layer is formed over the PPI. An opening is formed in the polymer layer. A compound is filled into the opening, wherein the compound is in physical contact with the PPI. The compound includes a flux and a polymer. A solder ball is placed on the compound, and is then reflowed to join the solder ball with the PPI.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   a metal pad over the substrate;
   a passivation layer comprising a portion over the metal pad;
   a post-passivation interconnect (PPI) electrically coupled to the metal pad, wherein the PPI comprises a portion over the metal pad and the passivation layer;
   a polymer layer over the PPI;
   a first solder ball over the PPI, wherein a portion of the solder ball extends into the polymer layer; and
   a compound comprising a first portion in contact with the PPI and the polymer layer, wherein the compound comprises flux and a polymer, and the compound comprises a bottom surface spaced apart from a top surface of the PPI by the polymer layer.

2. The device of claim 1, wherein compound is not in physical contact with the PPI.

3. The device of claim 1 further comprising:
   a second solder ball comprising a portion over the polymer layer, wherein the first solder ball and the second solder ball are neighboring solder balls;
   a second portion of the compound contacting the second solder ball; and
   a third portion of the compound adjoining the first solder ball and the polymer layer, wherein the second portion and the third portion of the compound are discrete portions, with no portion of the compound connecting the first portion to the second portion.

4. The device of claim 1 further comprising a second solder ball comprising a portion over the polymer layer, wherein the first solder ball and the second solder ball are neighboring solder balls, and wherein the compound continuously extend from the first solder ball to the second solder ball.

5. The device of claim 1 further comprising a package component bonded to the first solder ball, wherein the package component is selected from the group consisting essentially of a device die, a package substrate, and a printed circuit board (PCB).

6. The device of claim 1, wherein a top surface of the compound is lower than a top surface of the solder ball.

7. A device comprising:
   a substrate;
   a metal pad over the substrate;
   a passivation layer comprising a portion over the metal pad;
   a post-passivation interconnect (PPI) electrically coupled to the metal pad, wherein the PPI comprises a portion over the metal pad and the passivation layer;
   a polymer layer over the PPI;
   a first solder ball over and in physical contact with the PPI, wherein a portion of the first solder ball extends into the polymer layer;
   a second solder ball comprising a portion over the polymer layer, wherein the first solder ball and the second solder ball are neighboring solder balls; and
   a compound comprising a flux and a polymer, wherein the compound comprises a first portion contacting a sidewall of a mid-section of the first solder ball, and the first portion comprises a bottom surface in contact with a top surface of the polymer layer.

8. The device of claim 7, wherein the polymer in the compound comprises an epoxy.

9. The device of claim 7, wherein an interface between the first solder ball and the PPI is level with a bottom surface of the polymer layer.

10. The device of claim 7, wherein the compound comprises a second portion in a recess of the polymer layer, wherein the second portion is physically separated from the first portion.

11. The device of claim 7, wherein a top end of the compound is lower than a top end of the first solder ball.

12. A device comprising:
    a substrate;
    a metal feature over the substrate;
    a polymer layer overlapping portions of the metal feature;
    a solder region over and in physical contact with the metal feature, wherein a portion of the solder region extends into the polymer layer; and
    a compound comprising a flux and a polymer, wherein the compound comprises:
       a first portion in a recess of the polymer layer, and in a region formed by a bottom surface of the solder region, a sidewall of the polymer layer, and a top surface of the metal feature; and
       a second portion over a top surface of the polymer layer, wherein the second portion contacts a mid-section of the solder region, wherein the first portion and the second portion of the compound are physically disconnected from each other.

13. The device of claim 12 further comprising:
    a metal pad over the substrate; and
    a passivation layer comprising a portion over the metal pad, wherein the metal feature comprising a post-passivation interconnect (PPI) electrically coupled to the metal pad, and wherein the PPI comprises a portion over the metal pad and the passivation layer.

14. The device of claim 12, wherein the polymer in the compound comprises an epoxy.

15. The device of claim 12 further comprising a passivation layer underlying and in contact with the metal feature, wherein an entirety of the compound is higher than the passivation layer.

16. The device of claim 12, wherein a top end of the first portion of the compound is lower than a top surface of the polymer layer.

17. The device of claim 10, wherein an entirety of the first portion of the compound is higher than the passivation layer.

18. The device of claim 7, wherein the compound further comprises a portion in contact with each of the PPI, the polymer layer, and the first solder ball.

19. The device of claim 12, wherein the compound is in contact with each of the bottom surface of the solder region, the sidewall of the polymer layer, and the top surface of the metal feature.

* * * * *